(12) United States Patent
Ashida et al.

(10) Patent No.: US 6,463,087 B1
(45) Date of Patent: Oct. 8, 2002

(54) SEMICONDUCTOR LASER ELEMENTS AND METHOD OF MAKING SAME

(75) Inventors: Masayoshi Ashida; Satoshi Uchida, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/325,208

(22) Filed: Jun. 3, 1999

(30) Foreign Application Priority Data

Jun. 3, 1998 (JP) .......................................... 10-154916

(51) Int. Cl.[7] .................................................. H01S 5/22
(52) U.S. Cl. ........................................................ 372/46
(58) Field of Search ..................................... 372/44, 45

(56) References Cited

U.S. PATENT DOCUMENTS

| | | | | |
|---|---|---|---|---|
| 4,890,293 A | * | 12/1989 | Taneya et al. ................. | 372/46 |
| 5,394,421 A | * | 2/1995 | Ikawa et al. .................. | 372/45 |
| 5,518,954 A | * | 5/1996 | Yoo et al. ...................... | 438/40 |
| 5,781,577 A | * | 7/1998 | Nagai et al. ................... | 372/46 |
| 5,953,357 A | * | 9/1999 | Hirata et al. .................. | 372/46 |
| 5,966,397 A | * | 10/1999 | Hirata .......................... | 372/46 |
| 6,167,074 A | * | 12/2000 | Sun et al. ...................... | 372/46 |
| 6,195,375 B1 | * | 2/2001 | Hirata .......................... | 372/46 |

* cited by examiner

*Primary Examiner*—Paul Ip
*Assistant Examiner*—Jeffrey Zahn
(74) *Attorney, Agent, or Firm*—Beyer Weaver & Thomas LLP

(57) ABSTRACT

A semiconductor laser element is made by forming a lower clad layer, an active layer and an upper clad layer sequentially one on top of another on a semiconductor substrate, forming an etching stop layer completely over the upper clad layer, forming a contact layer on the etching stop layer, and etching portions of the contact layer to form steps. The etching stop layer has a slower etching speed than the contact layer against the etching liquid used for forming the steps by etching portions of the contact layer. An upper electrode is formed on the contact layer and a lower electrode is formed on the bottom surface of the substrate. The steps provide areas in the active layer where a current will not flow through.

19 Claims, 5 Drawing Sheets

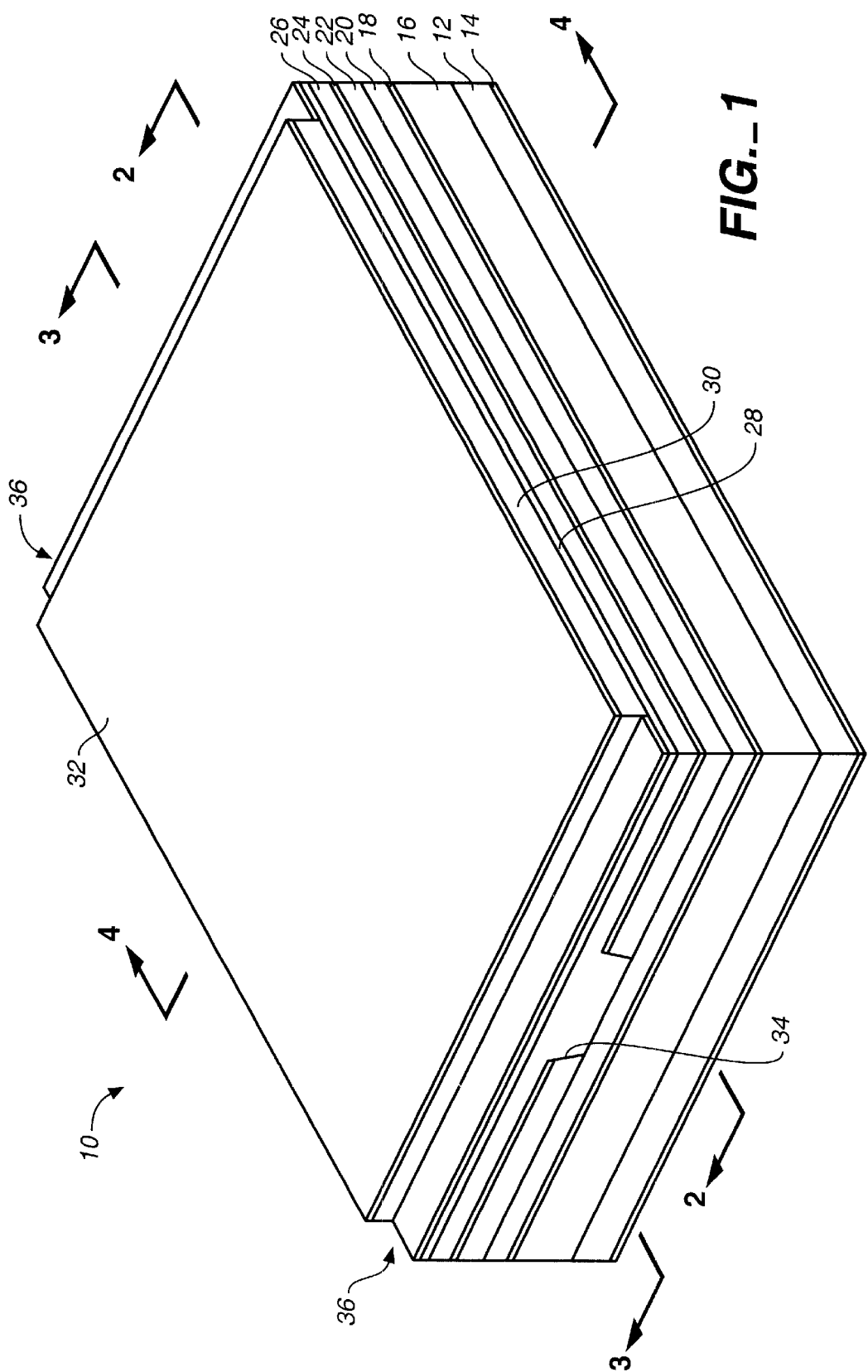
FIG._1

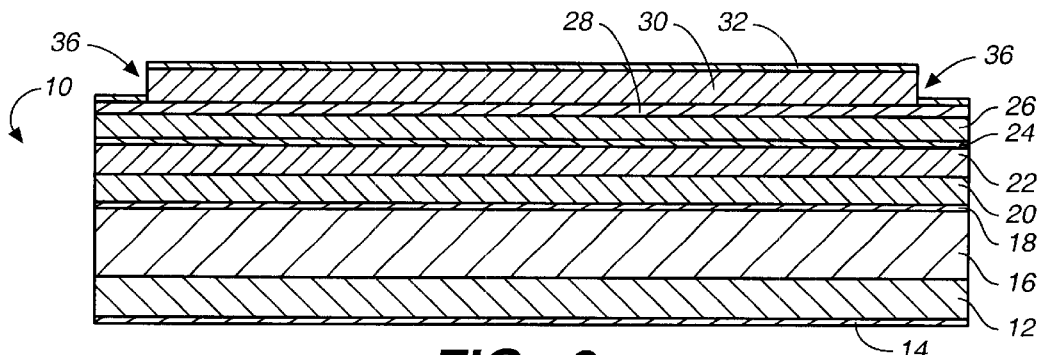
FIG._2
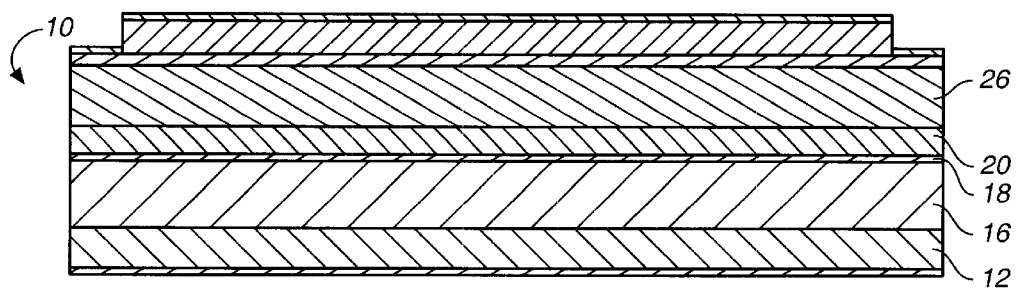
FIG._3
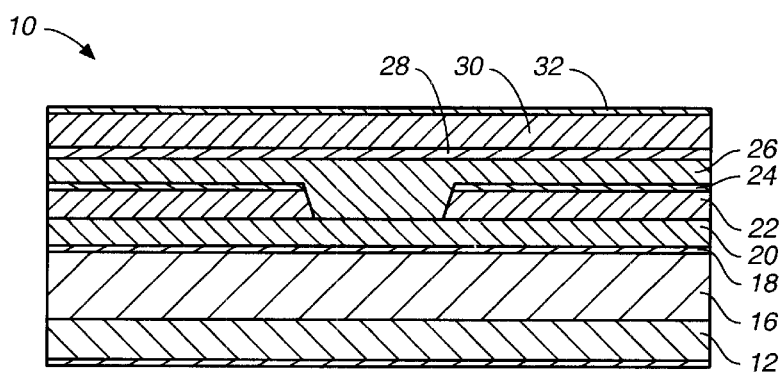
FIG._4

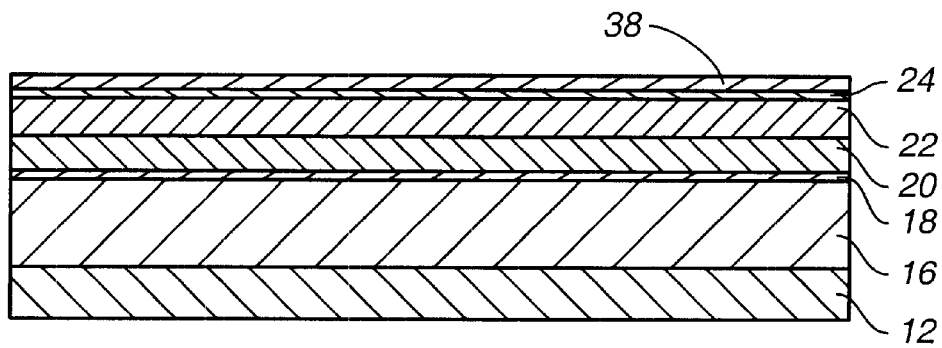
FIG._5A
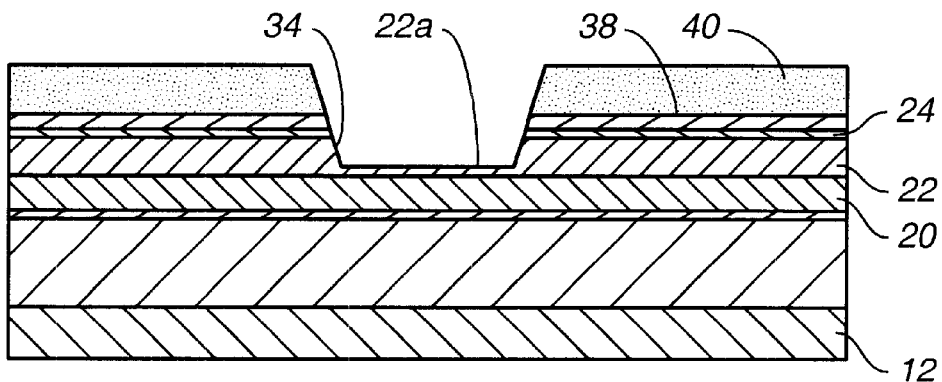
FIG._5B
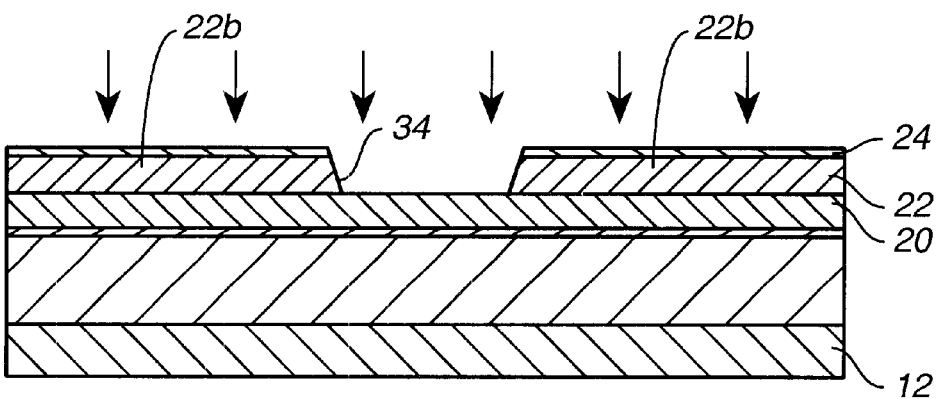
FIG._5C

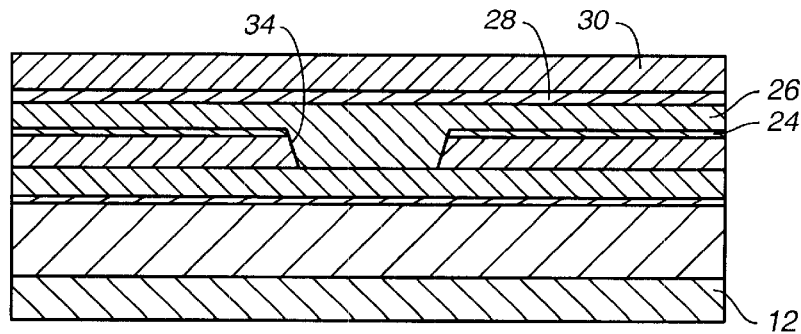
FIG._5D
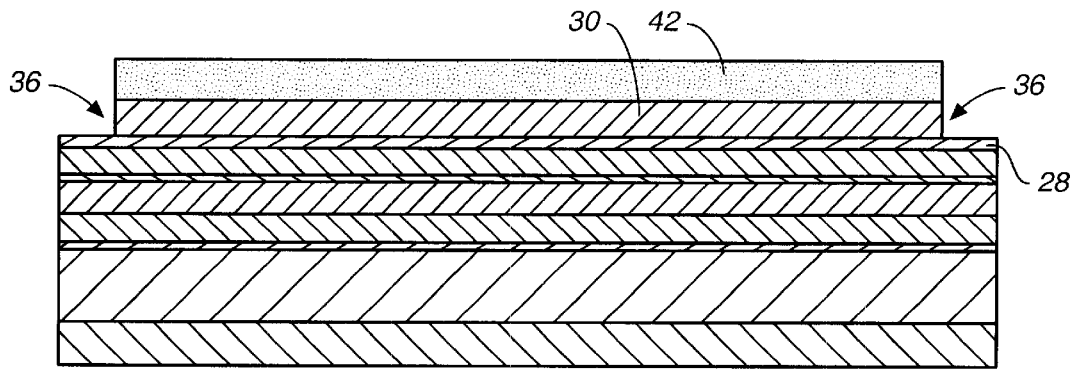
FIG._5E
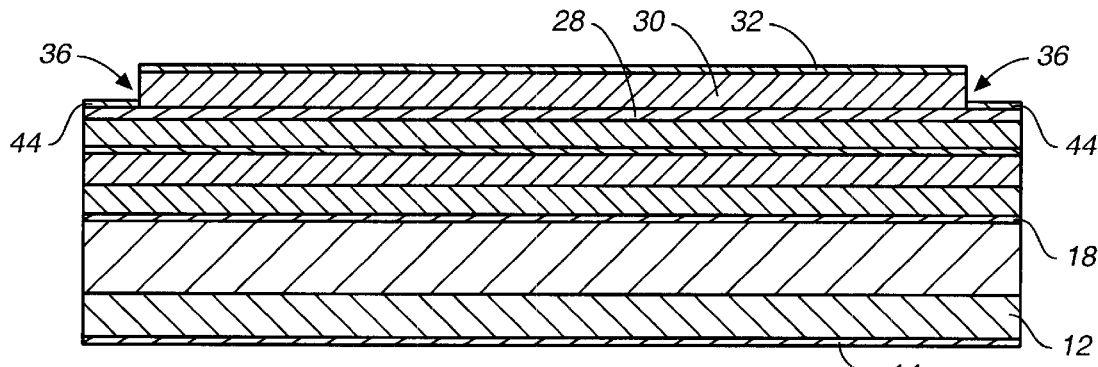
FIG._5F
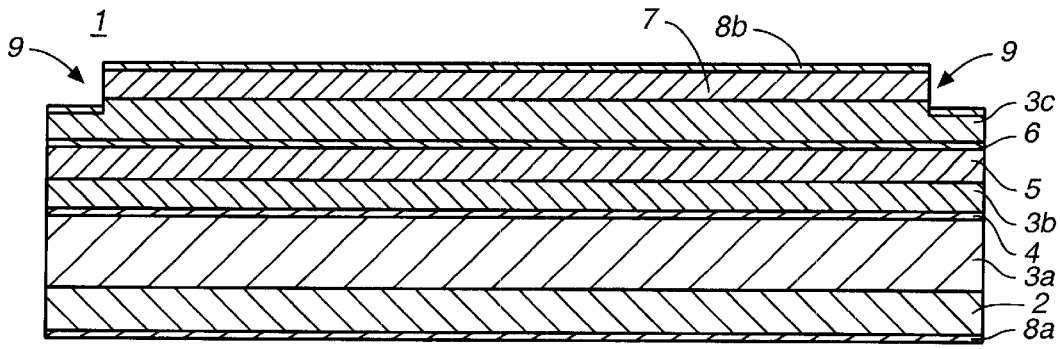
FIG._6B *(PRIOR ART)*

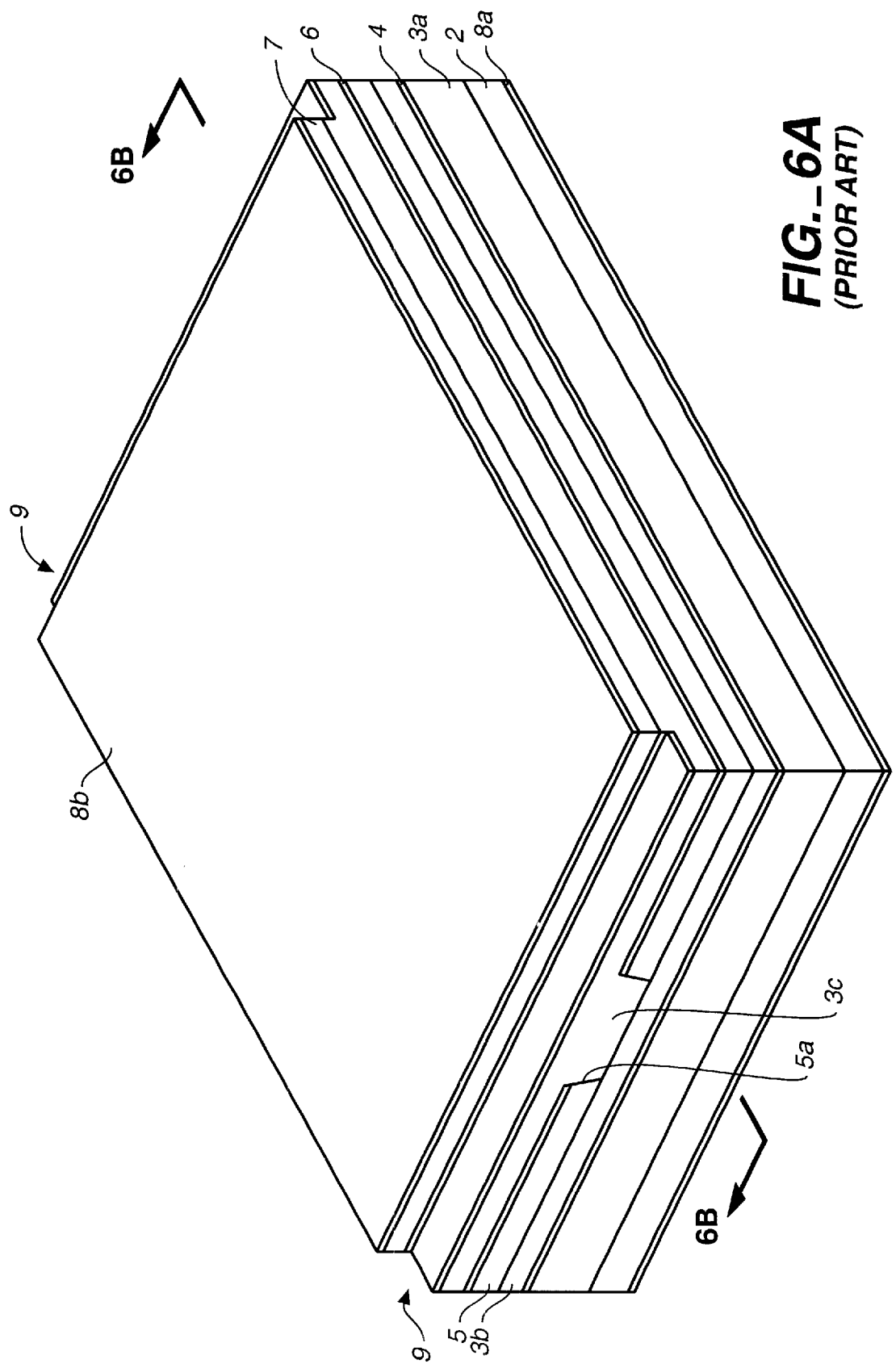
FIG._6A
(PRIOR ART)

SEMICONDUCTOR LASER ELEMENTS AND METHOD OF MAKING SAME

BACKGROUND OF THE INVENTION

This invention relates to semiconductor laser elements and more particularly to semiconductor laser elements of the kind having steps formed by etching away edge portions of its contact layer for an electrode at the top so as to provide regions in the active layer through which currents will not pass when a voltage difference is applied between the electrodes on the top and the bottom.

FIGS. 6A and 6B show an example of prior art method of making such a semiconductor laser element 1, disclosed in Japanese Patent Publication Tokkai 7-30190 laid open on Jan. 31, 1995. This semiconductor element 1 includes a semiconductor substrate 2 on which a lower clad layer 3a, an active layer 4, a first upper clad layer 3b, a current blocking layer 5, evaporation preventing layer 6, a second upper clad layer 3c and a contact layer 7 are sequentially formed in this order one on top of another, and a lower electrode 8a and an upper electrode 8b are formed respectively on the lower surface of the semiconductor substrate 2 and the upper surface of the contact layer 7. The current blocking layer 5 has a stripe-shaped groove 5a formed at its center, and the second upper clad layer 3c is formed so as to fill this groove 5a and to be thereby connected with the first upper clad layer 3b. Steps 9 are provided by removing two edge portions of the contact layer 7.

It is desirable to make the height of the steps 9 equal to the thickness of the contact layer 7 such that the regions not passing current therethrough can be formed in the active layer 4 without adversely affecting the ability of the second upper clad layer 3c to seal in light. Since the etching of the contact layer 7 is controlled by time according to the prior art technology, however, the height of the steps 9 tended to vary, depending on variations in the concentration of the etching liquid and the etching temperature, causing the laser characteristics to become unstable. In other words, if the steps 9 are too high, the second upper clad layer 3c becomes too thin and its ability to seal in light is adversely affected while, if the steps 9 are too low, the contact layer 7 is left in the steps 9, giving rise to the possibility of ill effects on the laser characteristics due to localized heat emission from the active layer 4 as a current is passed through.

SUMMARY OF THE INVENTION

It is therefore an object of this invention to provide semiconductor laser elements with reduced variations in the height of their steps such that their laser characteristics can be stabilized.

Another object of this invention is to provide a method of producing such semiconductor laser elements.

A semiconductor laser element according to this invention, with which the above and other objects can be accomplished, may be produced by forming a lower clad layer, an active layer and an upper clad layer sequentially one on top of another on a semiconductor substrate, forming an etching stop layer completely over the upper clad layer, forming a contact layer on the etching stop layer, and etching portions of the contact layer to form steps. The etching stop layer has a slower etching speed than the contact layer against the etching liquid used for forming the steps by etching portions of the contact layer. Thus, the time for the etching process can be set sufficiently long such that the portions of the contact layer can be completely removed and the height of the steps will be uniform and equal to the thickness of the contact layer. An upper electrode is formed on the contact layer and a lower electrode is formed on the bottom surface of the substrate. The steps provide areas in the active layer where a current will not flow through.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a diagonal view of a semiconductor laser element embodying this invention;

FIG. 2 is a sectional view of the semiconductor laser element of FIG. 1 taken along line 2—2 therein;

FIG. 3 is a sectional view of the semiconductor laser element of FIG. 1 taken along line 3—3 therein;

FIG. 4 is a sectional view of the semiconductor laser element of FIG. 1 taken along line 4—4 therein;

FIGS. 5A, 5B, 5C, 5D, 5E and 5F are sectional views of the semiconductor laser element of FIG. 1 at various stages of its production process; and FIG. 6A is a diagonal view of a prior art semiconductor laser element and FIG. 6B is its sectional view taken along line 6B—6B of FIG. 6A.

DETAILED DESCRIPTION OF THE INVENTION

The invention is described next by way of an example. FIGS. 1–4 show a semiconductor laser element 10 embodying this invention having an n-type (or "the first conductive type") semiconductor substrate 12 comprising GaAs. A lower electrode 14 comprising mainly of Au is formed on the lower surface of this substrate 12. An n-type lower clad layer 16, an active layer 18, a p-type (or "the second conductive type") first upper clad layer 20, an n-type current blocking layer 22, an n-type evaporation-preventing layer 24, a p-type second upper clad layer 26, an etching stop layer 28 and a contact layer 30 are sequentially stacked up in this order one on top of another on the upper surface of the substrate 12. The clad layers 16, 20 and 26 are layers which do not absorb light emitted from the active layer 18. The n-type lower clad layer 16 may comprise $Al_xGa_{1-x}As$ where $0.35 \leq x \leq 0.7$. The active layer 18 may be non-doped, n-type or p-type, having a quantum well structure formed by alternately stacking an layer of a first kind comprising $Al_xGa_{1-x}As$ where $0 \leq x \leq 0.15$ and an layer of a second kind comprising $Al_xGa_{1-x}As$ where $0.15 \leq x < 0.35$. The p-type first upper clad layer 20 may comprise $Al_xGa_{1-x}As$ where $0.35 \leq x < 0.7$. The n-type current blocking layer 22 may comprise GaAs. The n-type evaporation-preventing layer 24 may comprise $Al_xGa_{1-x}As$ where $0.1 \leq x < 0.7$. The p-type second upper clad layer 26 may comprise $Al_xGa_{1-x}As$ where $0.35 \leq x < 0.7$. The etching stop layer 28 contains P by more than 10% and may comprise $In_y(Ga_xAl_{1-x})_{1-y}P$ where $0.7 \leq x < 1.0$ and $0.4 \leq x < 0.6$. The contact layer 30 may comprise GaAs. An upper electrode 32 comprising mainly of Au is formed on the upper surface of this contact layer 30. A groove 34 in the form of a stripe (the "stripe groove") is formed at a center portion of the current blocking layer 22 from one edge to the opposite edge. The second upper clad layer 26 fills this stripe groove 34 so as to be in contact with the first upper clad layer 20, as shown in FIGS. 3 and 4. The two edge portions of the contact layer 30 are removed to form steps 36 such that a region not passing current therethrough is provided near a laser emitting edge surface of the active layer 18.

Next, there will be explained, with reference to FIGS. 5A, 5B, 5C, 5D, 5E and 5F, a method of making a semiconductor laser element of the so-called SAM type (self-aligned structure by molecular beam epitaxy), which excels in controllability and adaptability to mass production, among the semiconductor laser elements with a self-aligned structure disclosed in Japanese Patent Publication Tokko 1-37873.

First, the semiconductor substrate 12 is placed inside a device for molecular beam epitaxy (MBE) and materials such as Ga contained in individual sources are vaporized in the form of molecular beams. The layers of specified compounds with specified thicknesses as described above are thus formed by controlling the temperatures of the sources and their shutters in the known manner of operating such a device while monitoring each of the source materials by means of a mass spectrograph. Explained more in detail with reference to FIG. 5A, the lower clad layer 16 is formed on the semiconductor substrate 12 to the thickness of 10000–20000 Å, the active layer 18 is formed thereon to the thickness of 80–1000 Å, the first upper clad layer 20 is formed thereon to the thickness of 1000–4000 Å, the current blocking layer 22 is formed thereon to the thickness of 4000–8000 Å, the evaporation preventing layer 24 is formed thereon to the thickness of 600–800 Å and then a non-doped surface protecting layer 38 of GaAs to the thickness of 300–500 Å. Thereafter, the semiconductor substrate 12 with these layers formed thereon is taken out of the MBE device and, as shown in FIG. 5B, the surface protecting layer 38, the evaporation preventing layer 24 and the current blocking layer 22 are selectively etched by using a photoresist membrane 40 for masking, thereby forming a stripe-shaped groove 34 with width of about 2–6 μm. This etching process is controlled so as to leave a protecting membrane 22a of a specified small thickness (such as about 1000 Å) covering the first upper clad layer 20 at the bottom of this groove 34.

After this photoresist layer membrane 40 is removed, the layered structure is put inside the MBE device again and is exposed to a molecular beam of As at an elevated temperature of about 740–760° C. such that the surface protecting layer 38 and the protecting membrane 22a are evaporated, as shown in FIG. 5C. Since the evaporation preventing layer 24 is formed on the upper surface of the current blocking layer 22, the current blocking part 22b of the current blocking layer 22 is protected and does not evaporate during this process. In other words, the speed of evaporation of GaAs increases as the temperature rises but since the speed of evaporation of AlGaAs is hardly affected, the protecting membrane 22a and the surface protecting layer 38 which comprise GaAs, as well as the impurities which may have deposited during the etching process will be selectively evaporated while the first upper clad layer 20 and the evaporation preventing layer 24 comprising AlGaAs are not evaporated. As a result, the current blocking part 22b below the evaporation preventing layer 24 is protected. As the protecting membrane 22a is removed in this process, the surface of the first upper clad layer 20 under the groove 34 becomes exposed but since this process is carried out inside the MBE device, impurities are not deposited on the exposed surface.

Next, while the temperature of the semiconductor substrate 12 is maintained at about 580–600° C., the second upper clad layer 26 of thickness 6000–1800 Å, the etching stop layer 28 of thickness 300–3000 Å and the contact layer 30 of thickness 10000–30000 Å are formed sequentially in this order in the groove 34 and on the upper surface of the evaporation preventing layer 24, as shown in FIG. 5D. Next, as shown in FIG. 5E, the contact layer 30 is masked by a patterned photoresist membrane 42 and etched so as to form the steps 36 by removing two edge portions thereof For this etching process, use is made of an etching liquid containing sulfuiric acid or tartaric acid such as their aqueous solution having the characteristic of stopping etching of crystalline membranes of phosphorus such that the etching speed of the etching stop layer 28 will be slower than that of the contact layer 30. Thus, as shown in FIG. 5E, the contact layer 30 comprising GaAs is etched but the etching stop layer 28 comprising $In_x(Ga_xAl_{1-x})_{1-y}P$ is not etched. Thus, the height of the steps 36 does not become greater than the thickness of the contact layer 30.

Thereafter, as shown in FIG. 5F, the lower electrode 14 is formed on the lower surface of the semiconductor substrate 12 and the upper electrode 32 is formed on the upper surface of the contact layer 30 by vapor deposition or another method. Pieces of membrane 44 of the same material as the upper electrode 32 will be formed on the upper surface of the etching stop layer 28 where the steps 36 are formed but since these membrane pieces 44 and the upper electrode 32 are completely separated from each other by the steps 36 and are not electrically connected, they do not function as an electrode. Thus, a region passing no current therethrough will be formed in the active layer 18 below the steps 36.

According to this example of the invention, the etching process on the second upper clad layer 26 can be stopped by means of the etching stop layer 28 formed completely over the upper surface of the second upper clad layer 26. Thus, the time of etching can be set sufficiently long to completely remove the thick parts of the contact layer 30 and to make the height of the steps 36 uniform. Thus, the adverse effects on the laser light due to variations in the height can be prevented according to this invention.

Although the invention has been described above with reference to only one example, this example is not intended to limit the scope of the invention. Many modifications and variations are possible within the scope of this invention. Although the invention was described above as applied to an AlGaAs type laser device, for example, it can be applied to other kinds of laser using different materials such as InGaAlP type and InGaAsP lasers. As the etching stop layer 28, furthermore, phosphorus-containing crystalline membranes of other types such as GaP, InGaP and InAlP membranes may be used instead of a membrane of InGaAlP as described above. Moreover, an ordinary bulk active layer with a larger coefficient of refraction than the clad layers may be used as the active layer 18, instead of a quantum well type active layer described above. The layers of various compounds need not be formed by using an MBE device, but may be formed by a so-called chemical vapor deposition method with organic metal (MOCVD). The steps 36 are not required to be formed only near the laser light-emitting surface of the active layer 18 but such steps may also be formed at other positions where local heat emission presents a problem.

What is claimed is:

1. A semiconductor laser element comprising:
   a semiconductor substrate;
   a lower clad layer on said semiconductor substrate;
   an active layer on said lower clad layer, said active layer having a laser-emitting edge surface and emitting laser light from said laser-emitting edge surface;
   an upper clad layer on said active layer;
   an etching stop layer completely over an upper surface of said upper clad layer;
   a contact layer with steps extending perpendicular to said laser-emitting edge surface on said etching stop layer, said etching stop layer having a slower etching speed than said contact layer against a selected etching liquid; and an upper electrode on said contact layer.

2. The semiconductor laser element of claim 1 wherein said steps are formed proximally to said laser-emitting edge surface of said active layer.

3. The semiconductor laser element of claim 1 wherein said etching stop layer comprises a crystalline membrane containing phosphorus.

4. The semiconductor laser element of claim 2 wherein said etching stop layer comprises a crystalline membrane containing phosphorus.

5. The semiconductor laser element of claim 1 wherein said selected etching liquid contains sulfuric acid.

6. The semiconductor laser element of claim 1 wherein said selected etching liquid contains tartaric acid.

7. The semiconductor laser element of claim 1 wherein said steps have a height equal to thickness of said contact layer.

8. The semiconductor laser element of claim 1 wherein said steps have a uniform height which is equal to thickness of said contact layer.

9. The semiconductor laser element of claim 1 further comprising a lower electrode on said semiconductor substrate opposite from said lower clad layer.

10. A semiconductor laser element comprising:

a semiconductor substrate;

a lower clad layer on said semiconductor substrate;

an active layer on said lower clad layer, said active layer having a laser-emitting edge surface and emitting laser light from said laser-emitting edge surface;

a first upper clad layer on said active layer;

a current blocking layer on said first upper clad layer;

an evaporation preventing layer on said current blocking layer;

a second upper clad layer on said evaporation preventing layer;

an etching stop layer completely over an upper surface of said upper clad layer;

a contact layer with steps on said etching stop layer, said etching stop layer having a slower etching speed than said contact layer against a selected etching liquid; and an upper electrode on said contact layer.

11. The semiconductor laser element of claim 10 wherein said steps extend parallel to said laser-emitting edge surface.

12. The semiconductor laser element of claim 10 wherein said steps are formed proximally to said laser-emitting edge surface of said active layer.

13. The semiconductor laser element of claim 10 wherein said etching stop layer comprises a crystalline membrane containing phosphorus.

14. The semiconductor laser element of claim 11 wherein said etching stop layer comprises a crystalline membrane containing phosphorus.

15. The semiconductor laser element of claim 10 wherein said selected etching liquid contains sulfuric acid.

16. The semiconductor laser element of claim 10 wherein said selected etching liquid contains tartaric acid.

17. The semiconductor laser element of claim 10 wherein said steps have a height equal to thickness of said contact layer.

18. The semiconductor laser element of claim 10 wherein said steps have a uniform height which is equal to thickness of said contact layer.

19. The semiconductor laser element of claim 11 further comprising a lower electrode on said semiconductor substrate opposite from said lower clad layer.

* * * * *